United States Patent [19]

Ikeda

[11] Patent Number: 5,593,741
[45] Date of Patent: Jan. 14, 1997

[54] METHOD AND APPARATUS FOR FORMING SILICON OXIDE FILM BY CHEMICAL VAPOR DEPOSITION

[75] Inventor: Yasuo Ikeda, Tokyo, Japan

[73] Assignee: NEC Corporation, Tokyo, Japan

[21] Appl. No.: 495,873

[22] Filed: Jun. 28, 1995

Related U.S. Application Data

[63] Continuation of Ser. No. 159,231, Nov. 30, 1993, abandoned.

[30] Foreign Application Priority Data

Nov. 30, 1992 [JP] Japan ..................... 4-320973

[51] Int. Cl.$^6$ ..................... B05D 3/06
[52] U.S. Cl. ............ 427/579; 427/578; 427/573; 427/575; 427/255.3; 427/255.7; 427/419.3
[58] Field of Search ................. 427/579, 578, 427/573, 255.5, 255.3, 255.7, 575, 419.3; 118/719, 729

[56] References Cited

U.S. PATENT DOCUMENTS

| | | | |
|---|---|---|---|
| 4,987,005 | 1/1991 | Suzuki et al. | 427/578 |
| 5,124,014 | 6/1992 | Foo et al. | 427/579 |
| 5,124,180 | 6/1992 | Proscia | 427/255.3 |
| 5,271,972 | 12/1993 | Kwok et al. | 427/579 |
| 5,279,865 | 1/1994 | Chebi et al. | 427/579 |
| 5,314,724 | 5/1994 | Tsukune et al. | 427/578 |
| 5,356,722 | 10/1994 | Nguyen et al. | 427/569 |

FOREIGN PATENT DOCUMENTS 03-72077  3/1991  Japan.

OTHER PUBLICATIONS

H. Kotani et al., "Low–Temperature APCVD Oxide Using TEOS–Ozone Chemistry for Multilevel Interconnections", IEDM–89 (1980), pp., 669–672.

Y. Ikeda et al., "Ozone/Organic–Source APCVD for Conformal Doped Oxide Films", Journal of Electronic Materials, vol. 19, No. 1 (1990), pp. 45–49.

*Primary Examiner*—Roy V. King
*Attorney, Agent, or Firm*—Sughrue, Mion, Zinn, Macpeak & Seas

[57] ABSTRACT

The subject is a plasma-enhanced CVD process for depositing a silicon oxide film on a substrate by using an organosilicon compound such as tetraethoxysilane and oxygen or ozone as the essential reactants. The disclosed CVD method uses a plasma containing oxygen ions, and the density of oxygen ions impinging on the substrate surface is cyclically decreased and increased with a short period such as, e.g., 1 sec. In extreme cases which are rather preferable, the effect of the oxygen plasma is cyclically nullified and returned to a maximum to thereby alternate plasma CVD and plain thermal CVD. The obtained film is comparable in film properties to silicon oxide films deposited by known plasma CVD methods and, when the substrate has steps such as aluminum wiring lines, is better in step coverage and gap filling capability. The film exhibits a still better profile when hydrogen peroxide gas or an alternative hydrogen containing gas is added to the reactant gas mixture.

21 Claims, 13 Drawing Sheets

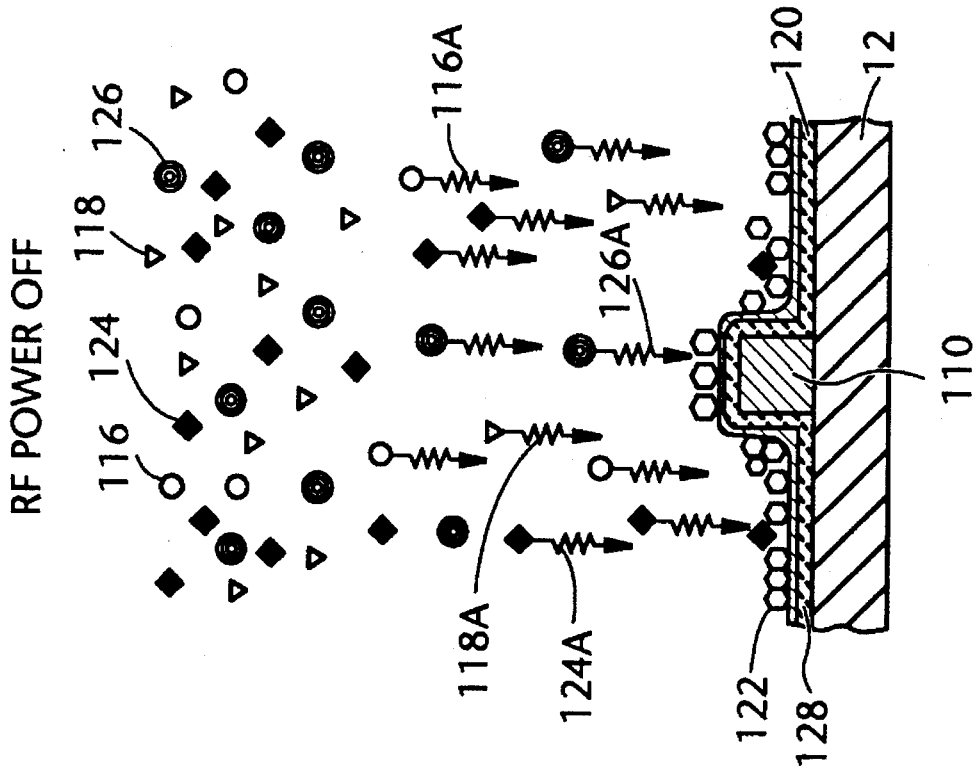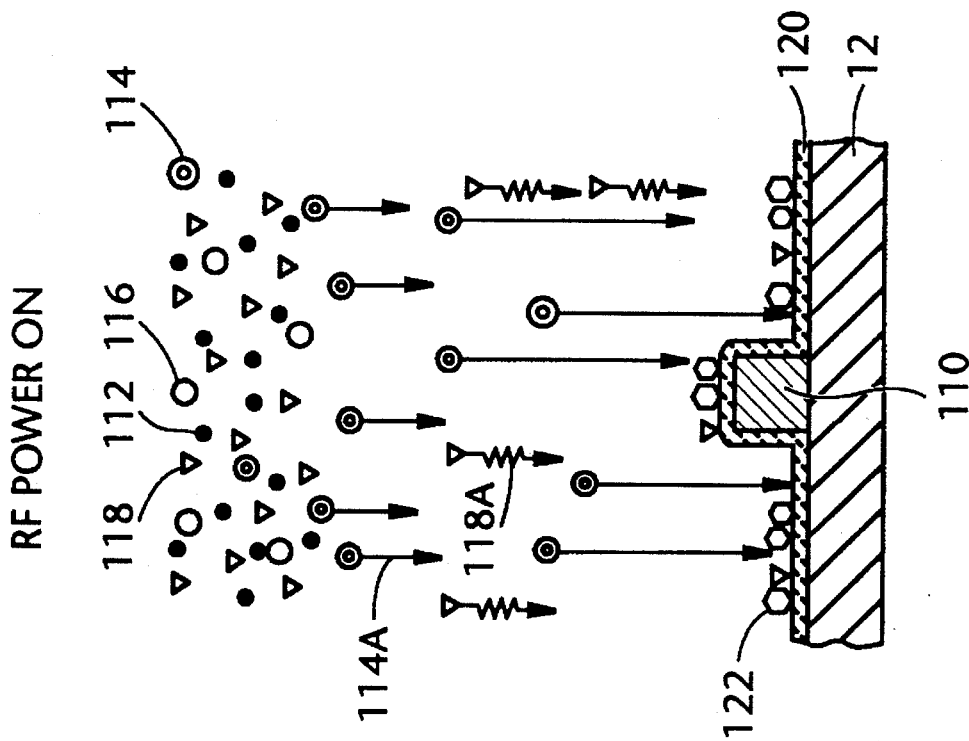

METHOD AND APPARATUS FOR FORMING SILICON OXIDE FILM BY CHEMICAL VAPOR DEPOSITION

This is a Continuation of application Ser. No. 08/159,231 filed Nov. 30, 1993.

BACKGROUND OF THE INVENTION

This invention relates to an improved method of forming a silicon oxide film on a substrate by plasma-enhanced chemical vapor deposition (CVD) using an organosilicon compound as the silicon source and apparatus for the improved CVD method.

In the fabrication of semiconductor devices, a widely employed technique for forming a silicon oxide film on a substrate is CVD using the reaction between a silicon source gas and oxygen gas. For this purpose a conventional silicon source gas is a silane, but recently attention has been devoted to the use of an organosilicon compound such as tetraethoxysilane in view of, in particular, improved step coverage of the film deposited on a substrate surface having steps such as aluminum wiring lines.

In using tetraethoxysilane it is known to use ozone, as an oxygen gas containing about 1–10% of ozone, in order to accomplish CVD at relatively low temperatures and also to increase the deposition rate. Also it is known to employ plasma-enhanced CVD (herein, plasma CVD for brevity) in order to further increase the deposition rate and enhance the quality of the deposited films. However, on a substrate having steps the film deposited by plasma CVD is insufficient in step coverage and cannot always fill spaces between the steps. In the case of narrow spaces with aspect ratios greater than 1, often voids remain in the plasma CVD film filling the spaces.

As a remedy for inferior step coverage of the plasma CVD film, it has been tried to alternate plasma CVD and plain heat-initiated CVD (herein, thermal CVD for brevity) using tetraethoxysilane and ozone. A silicon oxide film formed by this method has a multilayer structure, wherein each layer formed by thermal CVD is fairly good in step coverage and gap filling capability and hence compensates the inferior step coverage of the adjacent layers formed by plasma CVD. However, in this multilayer film the layers formed by thermal CVD do not possess good properties of plasma CVD films and often contain considerable moisture. Therefore, in the case of using the multilayer film as a dielectric film in a semiconductor device with multilayer interconnections there are possibilities of defects such as interlayer peeling and bad contacts in through-holes formed in the dielectric film. To solve these problems it is effective to considerably increase the ozone concentration in the thermal CVD process, but a disadvantage of this measure is that step coverage of the thermal CVD layers becomes inferior.

In forming a silicon oxide film as an interlayer dielectric film in a semiconductor device with multilayer interconnections, another technique to compensate insufficient step coverage and gap filling capability of a plasma CVD film is the application of a silica dispersion liquid. Initially a plasma CVD film is deposited on a substrate formed with aluminum wiring lines to a thickness limited so as not to leave voids in the film in the spaces between the wiring lines. Then a silica dispersion liquid is applied onto the plasma CVD film, followed by a heat treatment at a relatively low temperature for evaporating the solvent and another heat treatment at a higher temperature for enhancing the quality of the silica film. The application of the silica dispersion liquid and the heat treatments are repeated until the silica film surface becomes nearly flat over the aluminum lines and spaces between the lines. Then the silica film is planarized by a reactive ion etching method. If the plasma CVD film on the aluminum lines is exposed by this etchback operation there arises a local increase in the etch rate of the silica film by the action of oxygen supplied from the plasma CVD film, and hence the etched silica film surface becomes dented in areas over the spaces between aluminum lines. Finally another plasma CVD film is deposited on the planarized silica film. This method needs complicated operations and tends to suffer from low yield.

SUMMARY OF THE INVENTION

It is an object of the present invention to provide an improved method of forming a silicon oxide film on a substrate by plasma CVD using an organosilicon compound as the silicon source in order that the deposited film may be equivalent in film properties to silicon oxide films deposited by known plasma CVD methods and better in step coverage and gap filling capability.

It is another object of the invention to provide apparatus for performing the method according to the invention.

The invention provides a method of forming a silicon oxide film on a heated substrate by CVD using an organosilicon compound gas and oxygen gas as essential reactants. In this method a plasma containing oxygen ions is produced such that oxygen ions in the plasma impinge on the substrate surface, and, according to the invention, the density of oxygen ions impinging on the substrate surface is cyclically decreased and increased with a short period such that a surface layer of the silicon oxide film formed while the density of oxygen ions is decreased is so thin as to be readily improved in film properties when the density of oxygen ions is again increased.

In this method the aforementioned oxygen gas may contain ozone.

In an embodiment of the invention an organosilicon compound gas and oxygen gas are fed into a reaction chamber in which the substrate is kept heated, and a plasma containing oxygen ions is produced in the reaction chamber by applying RF power to the reactant gas mixture such that oxygen ions drift toward the substrate and impinge on the substrate surface. The RF power is cyclically decreased and increased with a short period to thereby cyclically decrease and increase the density of oxygen ions impinging on the substrate surface.

Another embodiment uses a reaction chamber which is divided into at least one thermal CVD zone and at least one plasma CVD zone such that the thermal CVD zone(s) and the plasma CVD zone(s) are alternately arranged. An organosilicon compound gas and oxygen gas are fed into evey zone of the reaction chamber, and a plasma containing oxygen ions is produced in each plasma CVD zone. In this reaction chamber the substrate is kept heated and moved so as to alternately pass through the thermal CVD zone(s) and the plasma CVD zone(s) at a relatively high speed corresponding to the short period of the cyclic change of the RF power in the first embodiment.

In a still different embodiment, an organosilicon compound gas and oxygen gas are fed into a reaction chamber in which the substrate is kept heated, and a plasma containing oxygen ions is produced in an ion source chamber which is contiguous to the reaction chamber such that oxygen ions can drift toward the substrate in the reaction chamber and impinge on the substrate surface. In this case the drift of oxygen ions from the ion source chamber into the reaction chamber is cyclically blocked and allowed with a short period to thereby cyclically decrease and increase the density of oxygen ions impinging on the substrate surface.

This invention is a sort of plasma CVD method, and the principal feature of the invention is to cyclically decrease and increase the density of oxygen ions impinging on the substrate surface. In other words, the intensity of an oxygen plasma acting on the substrate surface is cyclically varied with a short period. It is preferable to cyclically decrease the density of oxygen ions on the substrate surface to zero or nearly zero and increase to a maximum to thereby cyclically alternate thermal CVD and plasma CVD. It is important to make the cyclic change with a short period, which is preferably in the range from about 0.1 sec to about 30 sec.

In the course of forming a silicon oxide film by a method according to the invention, a surface layer of the film formed at each thermal CVD stage differs in film properties from a plasma CVD film, but this surface layer is very thin because of the short period of the cyclic change between thermal CVD and plasma CVD. Therefore, the film properties of the surface layer formed by thermal CVD are easily improved at the next plasma CVD stage. As the result, the deposited film becomes homogeneous and possesses good properties inherent to a film deposited by plasma CVD. The film is sufficiently low in moisture content and low in stress. In the case of film deposition on a substrate surface having steps, the temporary surface layers of the film formed by thermal CVD stages serve the purpose of compensating or correcting low conformality of the adjacent layers formed by plasms CVD stages. Therefore, the finally obtained silicon oxide film is very good in step coverage and completely fills the spaces or gaps between the steps. By a method according to the invention it is possible to fill narrow gaps with aspect ratios greater than 1 without leaving voids.

It is possible to further smoothen the profile of a film deposited by a method according to the invention on a substrate surface having steps by adding hydrogen peroxide gas, or an alternative hydrogen containing gas, to the reactant gas mixture containing an organosilicon compound gas and oxygen or ozone-oxygen gas.

The invention is very suitable for application to intelayer dielectric films in semiconductor devices with multilayer wirings. A sufficiently thick and void-free dielectric film can be deposited by a method according to the invention. Therefore, planarization of the dielectric film can easily be accomplished by a simple technique as will be described hereinafter.

BRIEF DESCRIPTION OF THE DRAWINGS

FIGS. 3(A) and 3(B) are explanatory illustrations of a cyclic change in the mechanism of film deposition in the CVD process of the first example;

DESCRIPTION OF THE PREFERRED EMBODIMENTS

In this invention an organosilicon compound is used as the silicon source. It is convenient to use tetraethylorthosilicate (tetraethoxysilane) $Si(OC_2H_5)_4$, abbreviated to TEOS, but this is not limitative. For example, alternatively useful organosilicon compounds are tetramethylsilane $Si(CH_3)_4$, triethoxysilane $SiH(OC_2H_5)_3$, tetramethylcyclotetrasiloxane $Si_4O_4H_4(CH_3)_4$, octamethylcyclotetrasiloxane $Si_4O_{12}(CH_3)_8$, hexamethyldisilazane $(CH_3)_3SiNHSi(CH_3)_3$, tris(dimethylamino)silane $SiH[N(CH_3)_2]_3$ and tris(diethylamino)silane $SiH[N(C_2H_5)_2]_3$.

As the oxygen source, either pure oxygen gas or an ozone containing oxygen gas is used. In the latter case the ozone concentration is usually from 1 to 10% by volume.

EXAMPLE 1

Figure 1:
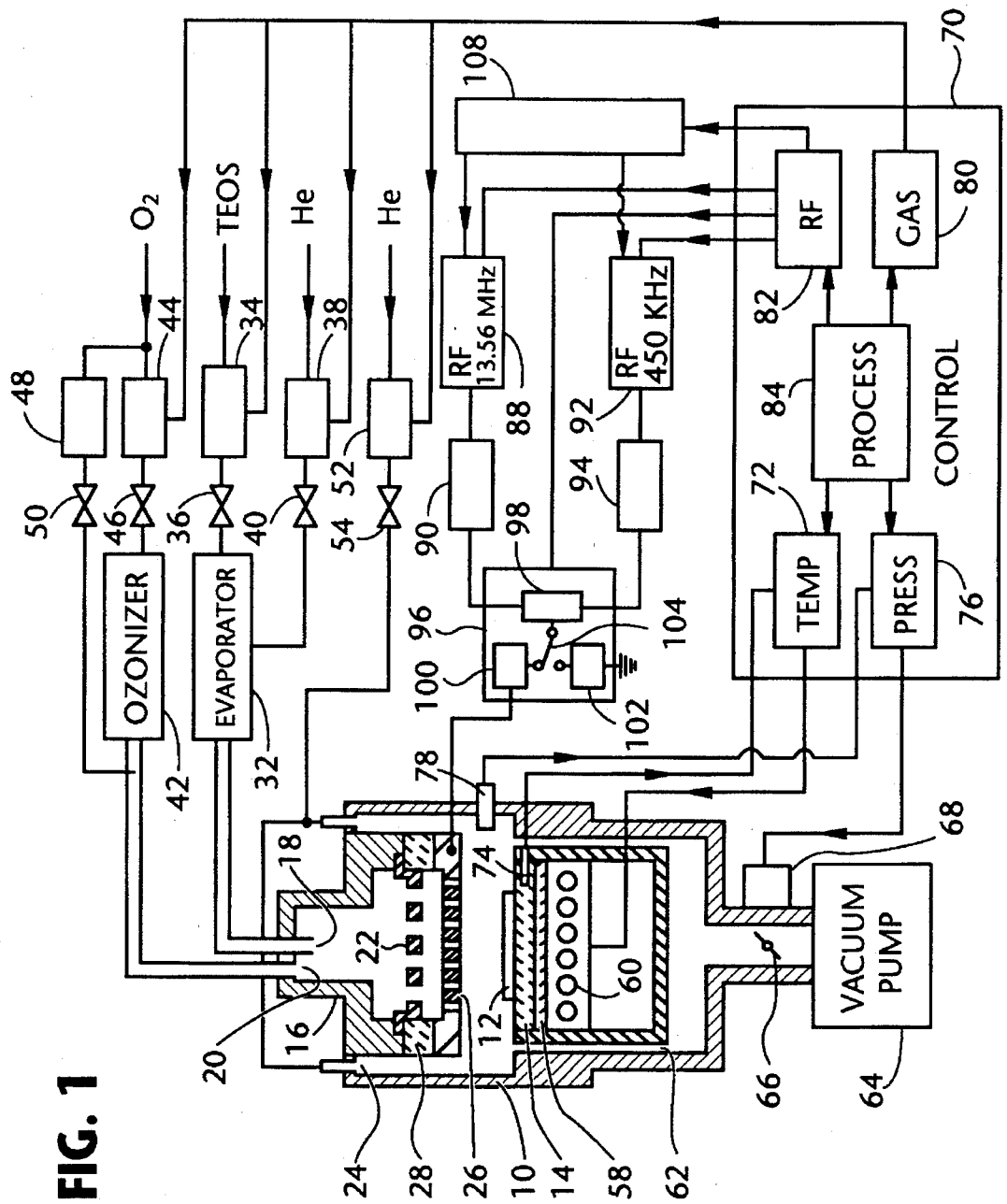
FIG. 1 is a diagrammatic illustration of a plasma CVD apparatus used in a first example of the invention.

FIG. 1 shows an example of plasma CVD apparatus according to the invention. This apparatus uses a conventional reaction chamber 10 in which a substrate 12 is placed on a silicon carbide susceptor plate 14.

An end section of the reaction chamber 10 is a gas intake manifold 16 having a silicon source gas intake 18 and an oxygen gas intake 20. The manifold 16 is bordered by a set of gas dispersion plates 22 to uniformly disperse a reactant gas mixture prepared in the manifold 16 into the reaction zone of the reaction chamber 10. Besides, the reaction chamber 10 has helium gas intakes 24. To feed TEOS gas into the reaction chamber 10 at a controlled flow rate, TEOS in liquid form is passed to an evaporator 32 through a liquid mass flow controller 34 and a valve 36. The evaporator 32 is kept heated so as to completely vaporize the supplied TEOS and is connected to the gas intake 18 of the manifold 16. As a carrier gas, helium gas is introduced into the evaporator 32 through a mass flow controller 38 and a valve 40 to bubble liquid TEOS in the evaporator 32. To feed oxygen gas containing ozone into the reaction chamber 10 at a controlled flow rate, oxygen gas is fed to an ozonizer 42 of the silent discharge type through a mass flow controller 44 and a valve 46. The ozonizer 42 is connected to the gas intake 20 of the manifold 16. A supplementary oxygen line including a mass flow controller 48 and a valve 50 by-passes the ozonizer 42 so that pure oxygen gas can be fed into the reaction chamber 10. Helium gas can be passed to the intakes 24 through a mass flow controller 52 and a valve 54.

In the reaction chamber 10, between the gas dispersion plates 22 and the substrate 12 there is an electrode 26 in the form of a shower head through which the reactant gas mixture is further uniformalized and directed toward the substrate 12. The electrode 26 is insulated from the other parts of the reaction chamber by an insulator ring 28. This electrode 26 is used to produce a plasma in the reaction zone between the electrode 26 and the susceptor plate 14.

The reaction chamber 10 is provided with heating lamps 60 arranged so as to heat the substrate 12 together with the susceptor plate 14 through a quartz plate 58. In CVD operation the substrate 12 is kept at a predetermined temperature which ranges from about 200° C. to about 450° C. The exhaust section 62 of the reacation chamber 10 is connected to a vacuum pump 64 so that the interior of the reaction chamber 10 can be maintained at a predetermined reduced pressure which ranges from about 0.1 torr to tens of torr. To minutely control the pressure there is a butterfly valve 66 of which the degree of opening can be controlled by a pulse motor 68.

To apply RF voltages to the electrode 26 in the reaction chamber 10 in order to produce a plasma, the apparatus includes a 13.56 MHz RF oscillator 88 provided with a high-pass filter 90 and a 450 kHz RF oscillator 92 provided with a low-pass filter 94. The RF voltages from these two oscillators 88, 92 are mixed in a matching box 96 containing a mixing circuit 98 to mix RF voltages of two different frequencies and a matching circuit 100 for impedance matching of the mixed RF voltages. Furthermore, the matching box 96 contains a dummy load 102 and a semiconductor switch 104 in order that the application of the RF voltages to the electrode 26 can be cyclically interrupted and resumed. A process controller 70 of the CVD apparatus includes a RF power controller 82 for cyclically turning on and off the switch 104. Besides, there is a pulse generator 108 which can be operated by the RF power controller 82 in order to vary the magnitude of the outputs of the RF oscillators 88, 92 to thereby vary the RF voltages applied to the electrode 26.

The process controller 70 includes a temperature controller 72 to control the temperature of the substrate 12 by using information from a temperature sensor 74 and a heating lamp controller (not shown), a pressure controller 76 to control the reduced pressure in the reaction chamber 10 by using information from a pressure sensor 78 and a valve opening controller including the aforementioned pulse motor 68, a gas controller 80 to control the mass flow controllers 34, 38, 44, 48 and 52 and a main controller 84 which governs the controllers 72, 76, 80 and 82.

Figure 2:
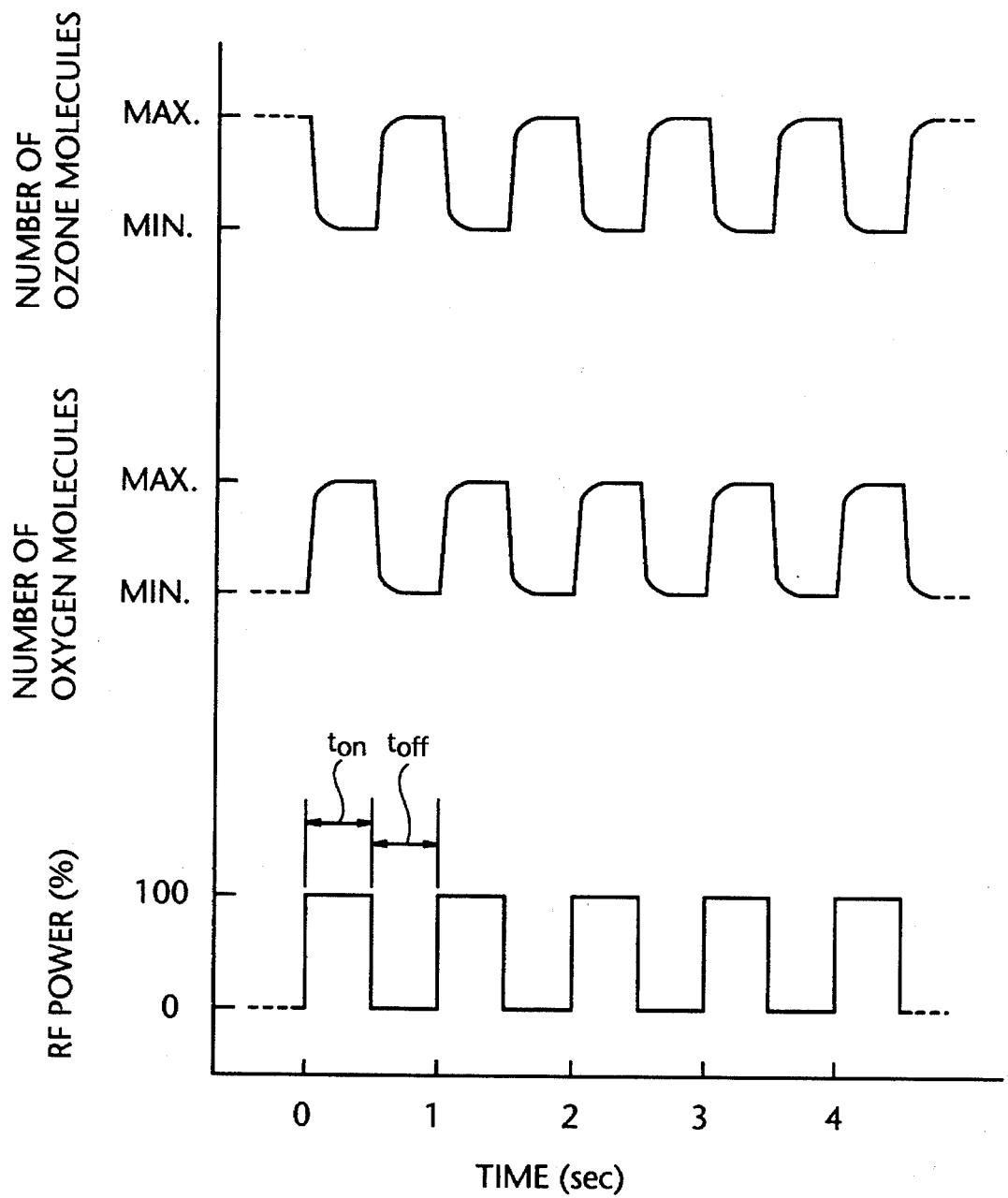
FIG. 2 is a chart illustrating a mode of operation of the apparatus of FIG. 1.

Referring to FIG. 2, in a plasma CVD operation in this example with the apparatus of FIG. 1, the RF power for producing a plasma is cyclically switched on and off with a period of 1 sec as illustrated at the bottom of the chart. In each cycle the length of on-time $t_{ON}$ is 0.5 sec, and the length of off-time $t_{OFF}$ is 0.5 sec. While the RF power is on a plasma is produced in the region between the electrode 26 and the susceptor plate 14 on which the substrate 12 is placed. The plasma contains oxygen ions formed by the decomposition of oxygen or ozone molecules. As the RF power is cyclically switched on and off the number of oxygen ions varies in the manner as shown in the middle section of the chart. The waveform of the number of oxygen ions has a drooping shoulder since it takes a certain time for the plasma to reach a stable state. Since ozone is less stable than oxygen, ozone molecules are more readily ionized by the application of RF power. Therefore, in the plasma the number of ozone molecules greatly decreases as shown at the top of the chart.

FIG. 3(A) is a model of the film deposition process in this example while the RF power is on. The surface of the substrate 12 has wiring steps 110, and it is assumed that the plasma CVD process has already proceeded to some extent to deposit a silicon oxide film 120 on the substrate 12. The plasma existing between the electrode 26 and the substrate 12 contains electrons 112, oxygen ions 114, oxygen radicals 116 and dissociated TEOS molecules 118. The oxygen ions 114, which are accelerated by a sheath voltage between the plasma and the substrate 12, drift toward the substrate 12 as indicated at 114A and impinge on the surface of the already deposited film 12. The dissociated TEOS molecules 118 diffuse toward the substrate 12 as indicated at 118A, and on the surface of the film 120 the diffused molecules decompose by heat and also by impacts by the oxygen ions and turn into a film-forming precursor 122. The precursor 122 further reacts with oxygen radicals and consequently turns into a new surface layer of the film 120. The precursor 122 has only a very short life because of very frequent oxygen ion bombardments on the surface, and hence the density of this precursor 122 on the surface of the deposited film 120 is very low. The oxygen ion bombardments have the effect of hardening the deposited film 120 and consequently forming a film of good properties with compressive stress.

Referring to FIG. 3(B), when the RF power is switched off both electrons and oxygen ions quickly decrease, whereas oxygen radicals 116 and dissociated TEOS molecules 118 slowly decrease as they drift toward the substrate 12, as indicated at 116A and 118A, respectively, and turn into the film-forming precursor 122. Besides, undecomposed TEOS molecules 124 and ozone molecules 126 diffuse toward the substrate 12, as indicated at 124A and 126A, respectively, and undergo reactions to form decomposed TEOS molecules and a film-forming precursor. In this case the film forming reactions are exclusively heat initiated chemical reactions. Therefore, on the surface of the already deposited film 120 the film-forming precursur 122 exists in high density, and this precursor provides a pseudo-liquid precursor layer 128 on the surface of the film 120. Since this pseudo-liquid precursor layer 128 exhibits fluidity, the resulting film has a relatively large thickness in areas over the bottom edges of each step 110 and exhibits a gently sloping profile on each side face of the step 110.

Figure 4A:
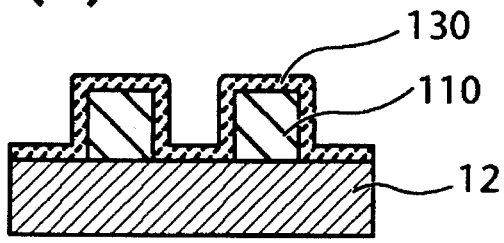
FIGS. 4(A), 4(B), 4(C), 4(D) and 4(E) show, in elevational sectional views, a film growing process in the first example.
Figure 4B:
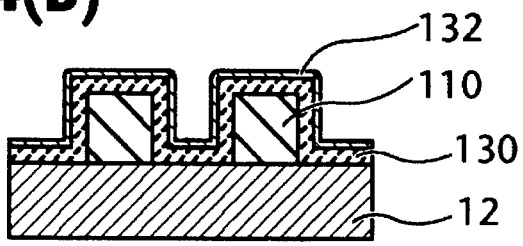
Figure 4C:
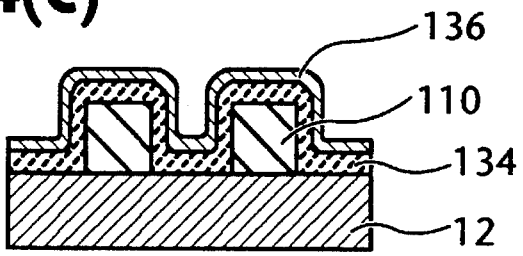
Figure 4D:
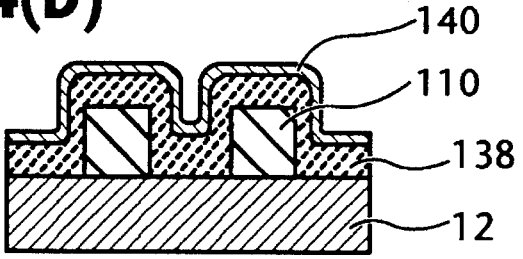
Figure 4E:
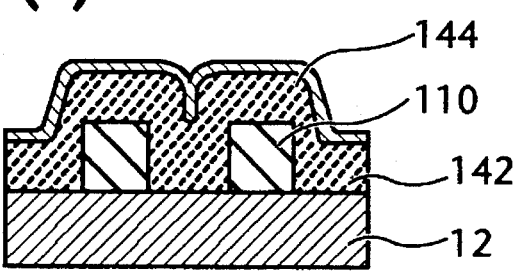

FIGS. 4(A) to 4(E) illustrate the process of growing a silicon oxide film by the method of Example 1. The substrate 12 is formed with aluminum wiring lines 110. Initially the RF power is applied for 0.5 sec to deposit a first plasma CVD film 130 shown in FIG. 4(A). The film 130 has a thickness of about 10 nm. Then the RF power is switched off for 0.5 sec to deposit a first thermal CVD film 132 shown in FIG. 4(B) on the initially deposited film 130. This film 132 is as thin as about 1 nm because of not using plasma. Then the RF power is applied for 0.5 sec. At the initial stage of this 0.5 sec operation, oxygen ion bombardments cause the thin film 132 to change properties so as to become equivalent to a plasma CVD film. That is, the thin thermal CVD film 132 in FIG. 4(B) becomes indistinguishable from the underlying plasma CVD film 130 and incorporated in the film 130. In FIG. 4(C) the film 134 is the result of incorporation of the film 132 in FIG. 4(B) in the plasma CVD film 130. The thermal CVD film 132 can fill narrow spaces between the aluminum lines 110 by the effect of the pseudo-liquid precursor layer described hereinbefore and therefore exhibits a gently sloping profile at the bottom of each step 110. Therefore, the film 134 has rounded profiles in narrow spaces between the steps 110. In this regard the film 134 is analogous to a thermal CVD film, though the film 134 has good properties of a plasma CVD film. On this film 134 a second plasma CVD film 136 deposits. Owing to the rounded profiles of the underlying film 134, the plasma CVD film 136 too has rounded profiles. Since the plasma CVD 136 is equivalent to the underlying film 134 in film properties, it can be said that the plasma CVD film 136 merges with the underlying film 134 to provide a plasma CVD film 138 shown in FIG. 4(D). Next, the RF power is off for 0.5 sec to deposit another thin thermal CVD film 140, which is analogous to the film 132 in FIG. 4(B), on the plasma CVD film 138. At the initial stage of the next 0.5 sec plasma CVD operation the film 140 changes its properties and merges with the plasma CVD film 138 while retaining the rounded profile of a thermal CVD film. In FIG. 4(E) the film 142 is the result of incorporation of the film 140 in FIG. 4(D) in the underlying film 138, and an additional plasma CVD film 144 is deposited. By repeating the above described cycles it is possible to form a sufficiently thick film which has good properties characteristic of a plasma CVD film and fills the spaces between the aluminum lines 110 without leaving voids.

With the apparatus of FIG. 1, an experiment was conducted on the influence of the duty ratio of the cyclically applied RF power. The definition of the duty ratio, D, is: $D = t_{ON}/(t_{ON} + t_{OFF}) \times 100\%$. When both $t_{ON}$ and $t_{OFF}$ are 0.5 sec as shown in FIG. 2 the duty ratio D is 50%.

Figure 5:
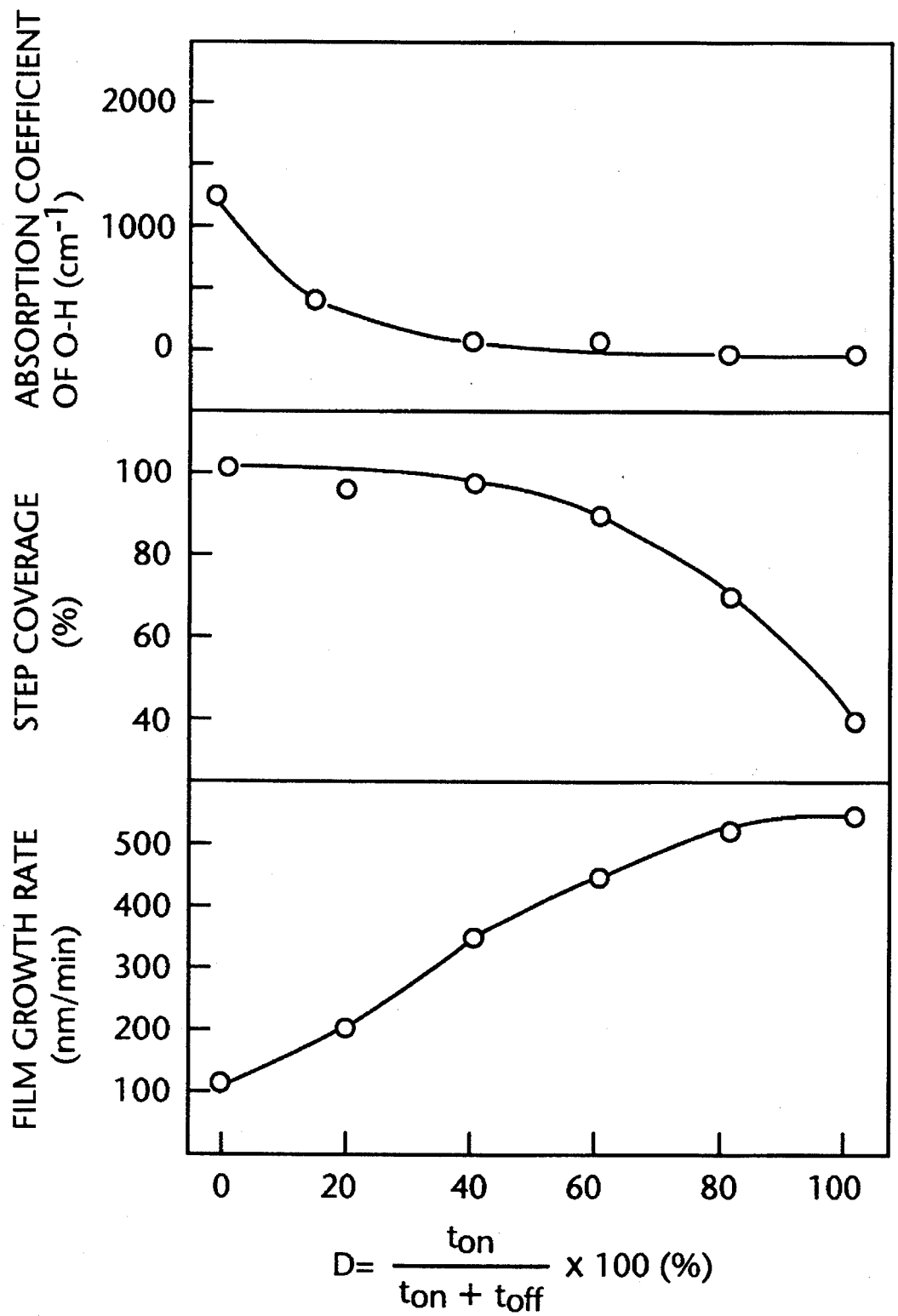
FIG. 5 is a graph showing the dependence of the film growth rate and film properties on the duty ratio of the cyclically applied RF power in the chart of FIG. 2.

FIG. 5 shows the experimental results. It is apparent that the film growth rate increases with an increase in the duty ratio D. However, step coverage of the deposited film becomes significantly inferior as D is made greater than 50%. On the other hand the absorption coefficient of O—H bond in the film, which is representative of and proportional to the moisture content in the film, reaches a sufficiently low level when D is greater than 40%. Thus, there is an optimum range of D, and in Example 1 it is suitable to determine D within the range from about 40% to about 60% in order to deposit a silicon oxide film with fairly good step coverage and low moisture content.

In Example 1 ozone is used together with oxygen, but this is not an indispensable requisite. In this invention it is also possible to use oxygen gas not containing ozone. Even in the absence of ozone in the reactant gases, similarly good results can be obtained by suitably determining the duty ratio D of the RF power because oxygen radical and dissociated TEOS molecules have relatively long lives. Also it is optional and unobstructive to use a reactant gas mixute containing, besides an organosilicon compound gas and oxygen or ozone-oxygen gas, an inorganic silicon compound represented by silane, a nitrogen compound represented by ammonia and/or a hydride or organic compound of a dopant element such as phosphorus, boron, arsenic or antimony.

A method according to the invention is advantageously applicable to the formation of planarized interlayer dielectric films in the fabrication of semiconductor devices with multilayer wirings.

Figure 6A:
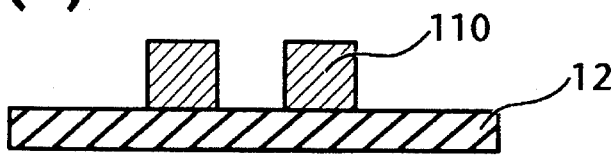
FIGS. 6(A), 6(B), 6(C), 6(D) and 6(E) show, in elevational sectional views, a process of forming a planarized dielectric film by using a method according to the invention in producing a semiconductor device with multilayer wirings.
Figure 6B:
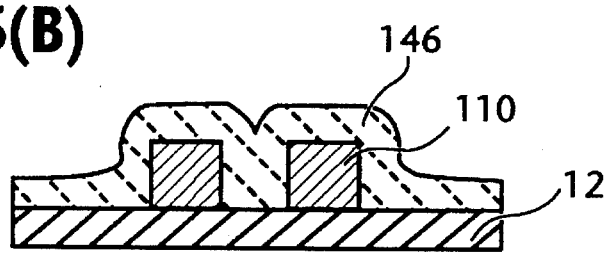
Figure 6C:
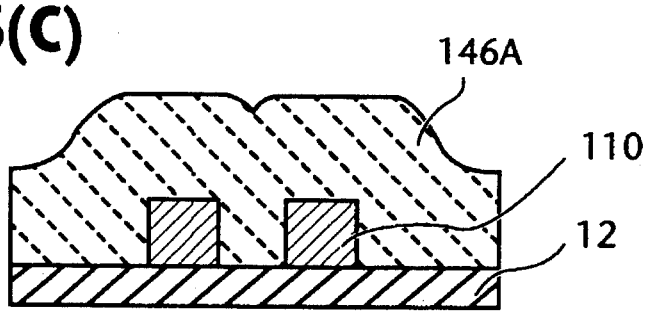
Figure 6D:
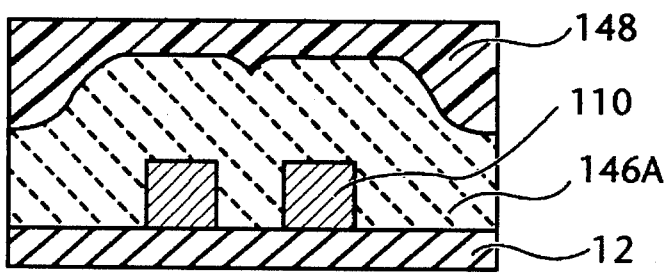
Figure 6E:
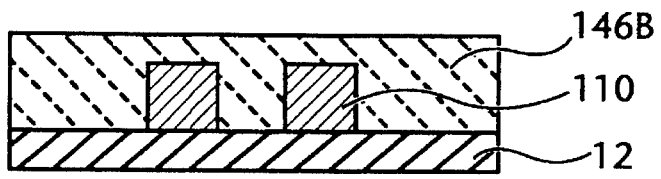

FIGS. 6(A) to 6(B) illusatrate a process of forming a planarized interlayer dielectric film. Referring to FIG. 6(A), aluminum wiring lines 110 are formed on a substrate 12 in which some semiconductor device components are formed in advance. Referring to FIG. 6(B), a silicon oxide dielectric film 146 is deposited on the substrate 12 by a plasma CVD method according to the invention such as the method of Example 1 using the CVD apparatus of FIG. 1. The dielectric film 146 is formed so as to cover the aluminum lines 110 and fill the spaces between the lines 110. The CVD operation is further continued until the deposited film becomes a very thick film 146A, shown in FIG. 6(C), which is thicker than the wiring lines 110. Then, as shown in FIG. 6(D), a resist 148 is applied to the surface of the thick dielectric film 146A, and the resist 148 is cured by baking. After that, etchback is made by a reactive ion etching method in which etching conditions are adjusted so as to equalize the etch rate of the cured resist layer 148 and the etch rate of the dielectric film 146A. The etchback is carried out until complete removal of the resist layer 148 and planarization of the exposed surface of the dielectric film 146A. Consequently, as shown in FIG. 6(E), a planarized dielectric film 146B is obtained. Alternative to the resist 148 in FIG. 6(D), it is optional to use a different material such as, for example, polyethylene or an organic SOG. Also it is optional to employ a mechanical polishing method as an alternative planarization method to thereby attain very good flatness over the entire area of the substrate.

EXAMPLE 2

Figure 7:
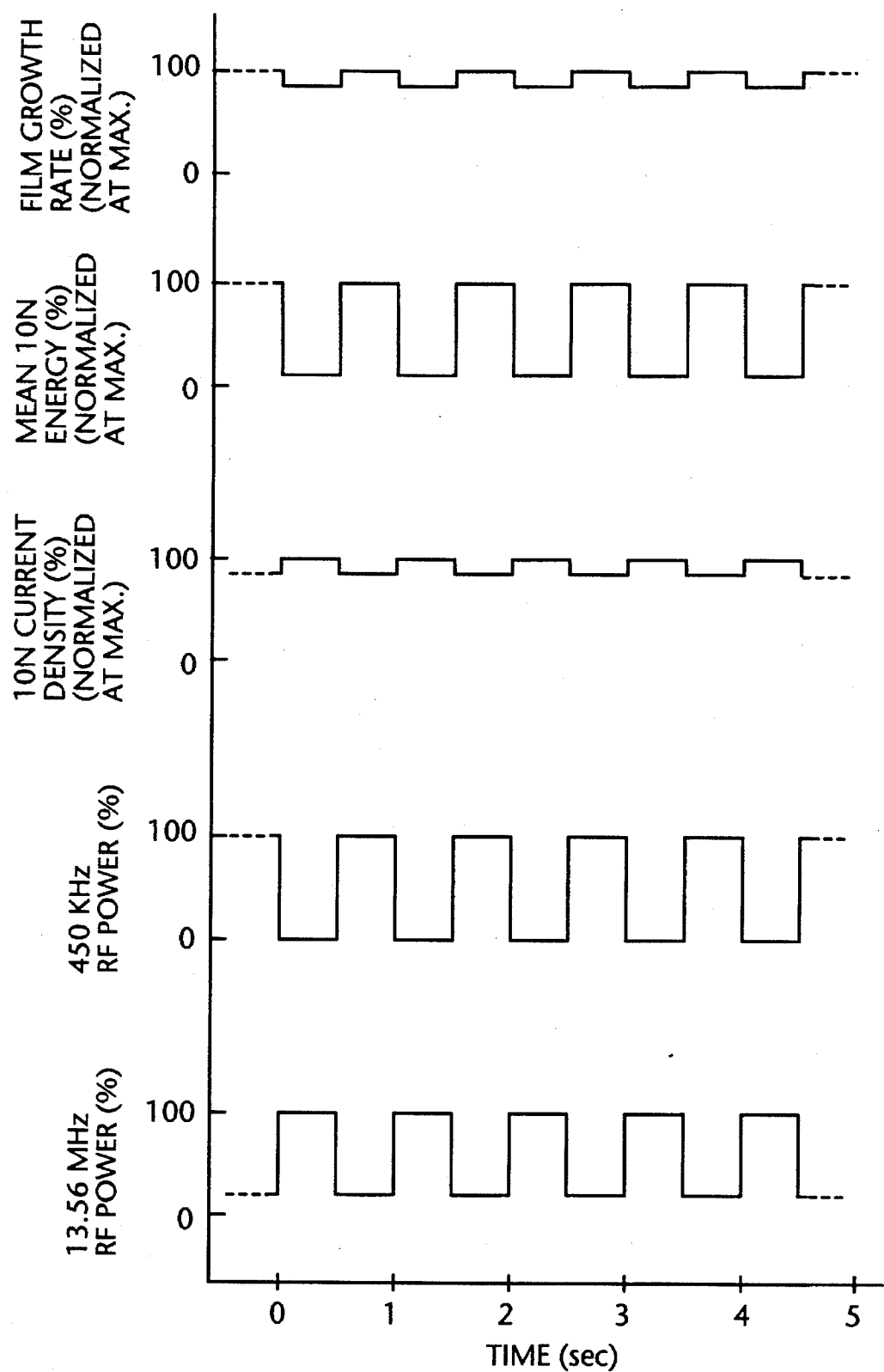
FIG. 7 is a chart illustrating a modified mode of operation of the CVD apparatus of FIG. 1 in a second example of the invention.

The plasma CVD apparatus of FIG. 1 is used with minor modifications. In this example the matching box 96 is modified such that 13.56 MHz RF voltage from the oscillator 88 and 450 kHz RF voltage from the oscillator 92 are individually applied to the electrode 26 in the reaction chamber 10. Furthermore, the pulse generator 108 commands the two RF oscillators 88 and 92 to cyclically vary the outputs in the manner as shown in FIG. 7. That is, at the electrode 26, each of 13.56 MHz RF power and 450 kHz RF power cyclically alternates between a maximum and a minimum with a period of 1 sec, but there is a half-cycle discrepancy in timing between the cyclic change of 13.56 MHz RF power and the cyclic change of 450 kHz RF power. When 13.56 MHz RF power is at the maximum 450 kHz RF power is at the minimum, and vice versa. As a result, in the plasma produced in the reaction chamber 10 there occur cyclic changes in ion current density and mean ion energy as shown in FIG. 7. That is, the ion current density exhibits only a small change with time, whereas the mean ion energy exhibits a great change so as to become maximum when 450 kHz RF power is at the maximum and minimum when 13.56 MHz RF power is at the maximum. This is because a sheath voltage between the plasma and the substrate 12 decreases when the frequency of the applied RF voltage is relatively high. As the ion energy is cyclically varied although the ion current density is not significantly varied, there occurs a cyclic change in the intensity of ion bombardments on the substrate surface. Therefore, a silicon oxide film deposited in this example is equivalent to the film deposited in Example 1 in film properties, step coverage and space filling capability. Compared with Example 1, the merit of this example is that a periodic change in the film growth rate becomes very small, viz. only about 10% as shown at the top of FIG. 7.

EXAMPLE 3

Figure 8:
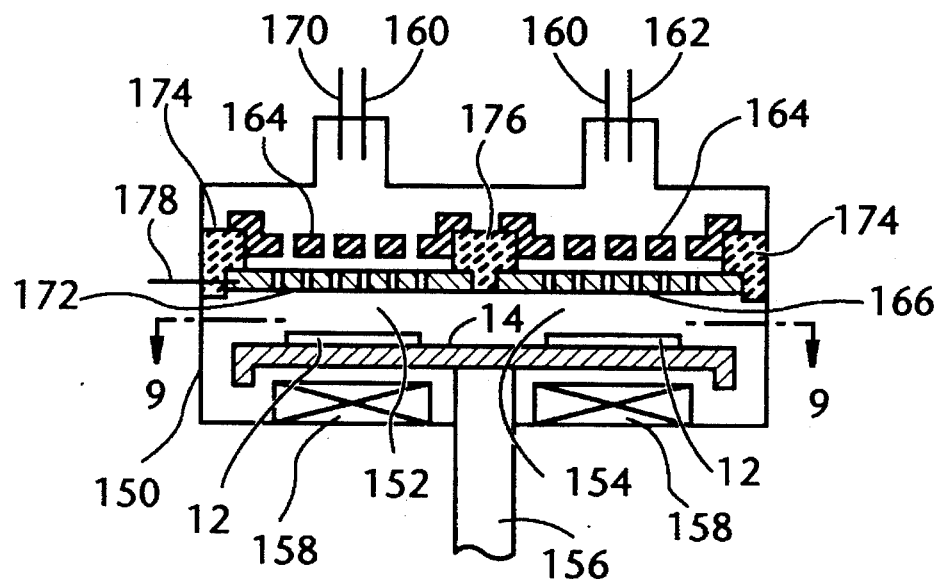
FIG. 8 is a schematic and longitudinal sectional illustration of the reaction chamber of another plasma CVD apparatus used in a third example of the invention.
Figure 9:
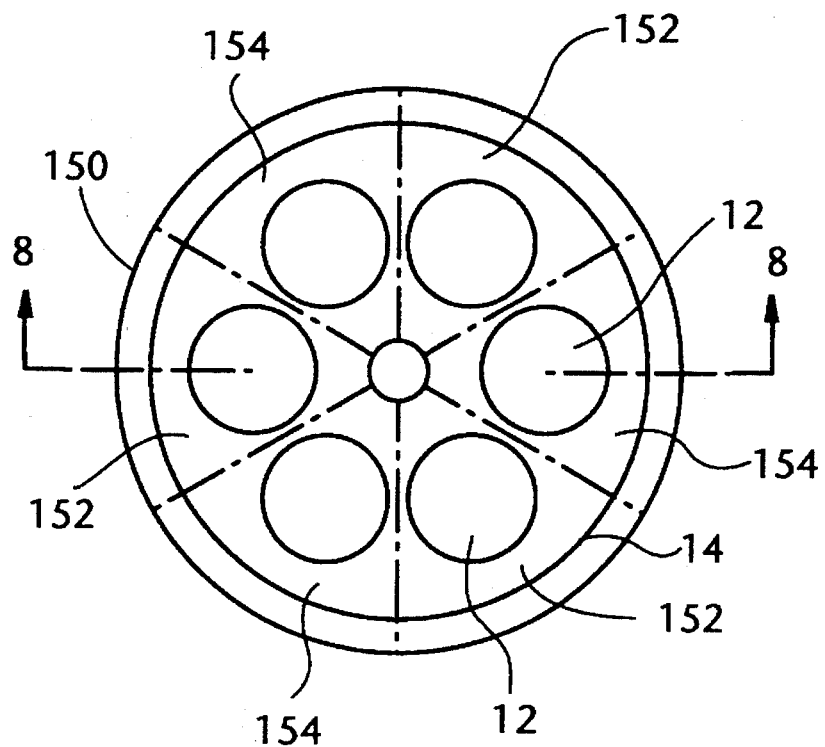
FIG. 9 is a cross-sectional view taken along the line 9—9 in FIG. 8.

FIGS. 8 and 9 show a cylindrical reaction chamber 150 used in this example. The cylindrical reaction chamber 150 is sectored into six zones, and these six zones are differently equipped such that three plasma CVD zones 152 and three thermal CVD zones 154 are alternately arranged. In the center of the reaction chamber 150 there is a rotary shaft 156, and a susceptor plate 14 is mounted on the rotary shaft 156 so that each of substrates 12 placed on the susceptor plate 14 can traverse the plasma CVD zones 152 and thermal CVD zones 154 alternately. Heaters 158 are provided on the back side of the susceptor plate 14 to keep the substrates 12 heated, for example, at about 350° C.

Each of the thermal CVD zones 154 is provided with a TEOS gas intake 160, an ozone-oxygen gas intake 162, gas dispersion plates 164 and a showering injector 166 such that a uniform mixture of TEOS and ozone-oxygen gases is supplied onto the surface of the substrate 12.

Each of the plasma CVD zones 152 is provided with a TEOS gas intake 160, an oxygen gas intake 170, gas dispersion plates 164 and an electrode 172 in the form of a shower head in the same manner as in the reaction chamber 10 in FIG. 1. The electrode 172 is insulated from the other parts of the reaction chamber 150 by an insulator ring 174 and an insulator column 176, and a 13.56 MHz or 450 KHz RF voltage (indicated at 178) is applied to the electrode 172 to produce a plasma in the space between the electrode 172 and the susceptor plate 14. In this example the RF voltage 178 is continuously applied to the electrode 172 in each plasma CVD zone 152.

In this reaction chamber, each substrate 12 on the rotating susceptor plate 14 is alternately subjected to thermal CVD and plasma CVD. In each thermal CVD zone 154 a thin film correponding to the film 132 in FIG. 4(B) is deposited. When the rotation speed of the susceptor plate 14 is about 10 rpm the thickness of this film becomes about 2 nm. Then, at the initial stage of plasma CVD in the adjacent plasma CVD zone 152, the thermal CVD film is affected by the plasma and becomes indistinguishable from a plasma CVD film, as described with reference to FIGS. 4(B) and 4(C). On the modified film, a plasma CVD film deposits to a thickness of 10 to 20 nm. While each substrate 12 traverses the thermal CVD zones 154 and plasma CVD zones 152 alternately, a CVD film excellent in step coverage and gap filling capability is formed.

The illustrated six-zone construction of the reaction chamber 150 is by way of example. The reaction chamber can be divided into any number of zones not smaller than two. Furthermore, any of the plasma CVD zones in the reaction chamber may be different from the others in the frequency or amplitude of the applied RF voltage. In this example the susceptor plate 14 is a turntable, but alternatively it is possible to use a cylindrical or prismatic susceptor which is rotatable about its longitudinal axis. In that case the substrates 12 are attached to the side face(s) of the susceptor, and in each CVD zone the showering electrode (172) or injector (166) is arranged opposite to the side face of the susceptor.

EXAMPLE 4

Figure 10:
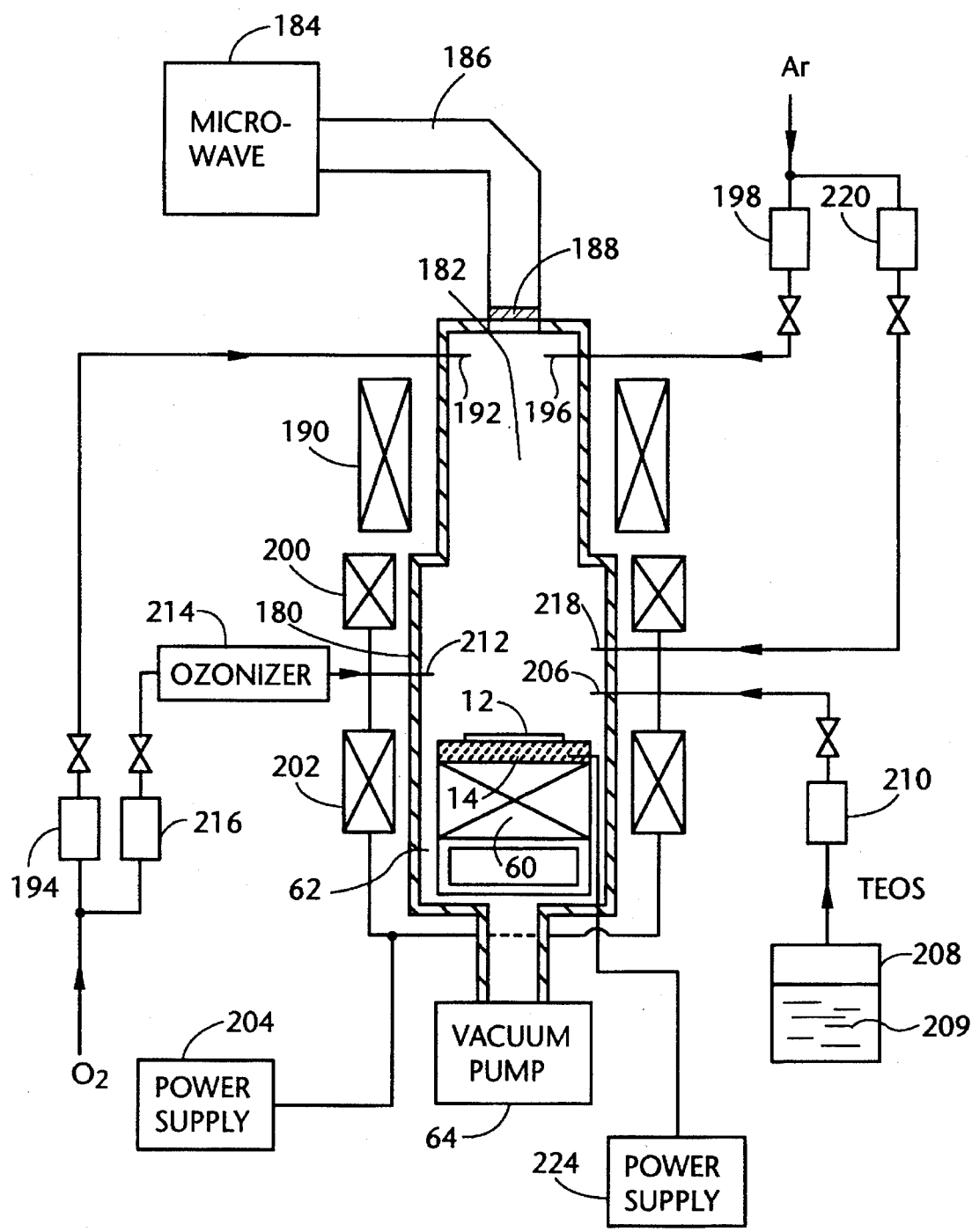
FIG. 10 is a diagrammatic illustration of a plasma CVD apparatus used in a fourth example of the invention.

FIG. 10 shows a plasma CVD apparatus used in this example. The apparatus includes an ion source chamber 182 which is contiguous to a reaction chamber 180. A microwave with a frequency of 2.54 GHz is transmittied into the ion source chamber 182 from a microwave source 184 through a waveguide tube 186 and an electro-magnetically transparent window 188. A primary electromagnet coil 190 surrounds the ion source chamber 182 to produce a magnetic field of 875 gauss in the chamber 182. The ion source chamber 182 is provided with an oxygen gas intake 192 to which oxygen gas flows through a mass flow controller 194 and an argon gas intake 196 to which argon gas flows through a mass flow controller 198. Using a vacuum pump 64 connected to the reaction chamber 180, the total gas pressure in the ion source chamber 182 is maintained at about 1 mtorr. In the ion source chamber 182 the magnetic field and the microwave induce electron cyclotron resonance (ECR) heating, which produces an oxygen plasma with high degree of ionization. An auxiliary electromagnet coil 200 surrounds a forward section of the reaction chamber 180 contiguous to the ion source chamber 182.

In the reaction chamber 180 a substrate 12 is placed on a susceptor plate 14 which is provided with a heater 60 to keep the substrate 12 heated at about 300° C. A reflecting electromagnet coil 202 surrounds the reaction chamber 180 at a section containing the susceptor plate 14. Indicated at 204 is a power supply to energize the electromagnet coils 190, 200, 202. Liquid TEOS 209 is vaporized in a thermostatic vessel 208 to feed TEOS gas into the reaction chamber 180 by a gas intake 206 through a mass flow controller 210. To feed oxygen gas containing ozone into the reaction chamber 180 by a gas intake 212, oxygen gas is supplied to an ozonizer 214 through a mass flow controller 216. As an inert diluent gas, argon gas can be introduced into the reaction chamber 180 by a gas intake 218 through a mass flow controller 220. The exhaust section 62 of the reaction chamber 180 is connected to the vacuum pump 64. The total gas pressure in the reaction chamber 180 is kept at about 1 mtorr.

In a plasma CVD operation with this apparatus, an oxygen plasma is produced in the ion source chamber 182 by actuating the microwave source 184 and primary electromagnet coil 190. A diverging magnetic field produced by the electromagnet coil 190 forces oxygen ions to flow out of the ion source chamber 182 into the reaction chamber 180. A suitable current is supplied to the auxiliary electromagnet coil 200 so as to produce a weak magnetic field in the direction from the ion source toward the substrate 12 with the purpose of uniformalizing the intensity of the oxygen plasma attracted into the reaction chamber 180. The reflecting electromagnet coil 202 is also energized so as to produce a weak magnetic field in the same direction. Under these conditions TEOS gas and ozone-oxygen gas are fed into the reaction chamber 180 to carry out plasma CVD until the thickness of a film deposited on the substrate 12 reaches about 10 nm. Then the current supplied to the auxiliary electromagnet 200 is reversed and intensified in order to produce a mirror magnetic field in the vicinity of the exit end of the ion source chamber 182 to thereby repulse the electrons and ions flowing out of the ion space chamber 182. As a result, only neutral particles such as oxygen radicals and oxygen molecules are supplied from the ion source chamber 182 onto the surface of the substrate 12, while TEOS gas and ozone-oxygen gas are supplied directly into the reaction chamber 180. Therefore, only reactions of thermal CVD type take place on the substrate surface to result in the deposition of a silicon oxide film with good step coverage.

The above described change of the current supplied to the auxiliary electromagnet coil 202 is cyclically made with a period of from about 1 sec to about 10 sec in order to cyclically change the quantity of oxygen ions arriving at the substrate surface between a maximum and nearly null. Therefore, plasma CVD and thermal CVD alternately take place, and every film formed by thermal CVD is transformed into a plasma CVD film by the next plasma CVD, in the same manner as in Example 1. The finally obtained film is good in step coverage and gap filling capability. Besides, a film formed by the method of this example can fill spaces or gaps with large aspect ratios since the pressure in the reaction chamber 180 is reduced to the extent of about 1 mtorr.

In this example, the repulsion of oxygen ions flowing from the ion source chamber 182 is made by a mirror magnetic field produced by the auxiliary electromagnet coil 202. Alternatively, it is possible to use the reflecting electromagnet 202 so as to produce a cusp field or to apply a positive voltage to the susceptor plate 14 (from a bias power supply 224) so as to produce a recoiling magnetic field. Still alternatively, it is possible to employ a mechanical shutter (not shown). In the case of using a mechanical shutter, oxygen radicals are blocked together with oxygen ions, and hence it is very favorable to supply ozone to the substrate surface from the ozonizer 214 for promoting thermal CVD. The ion source of ECR type may be replaced by any other oxygen ion source insofar as the intensity of oxygen ions in the reaction chamber can be varied.

EXAMPLE 5

Figure 11:
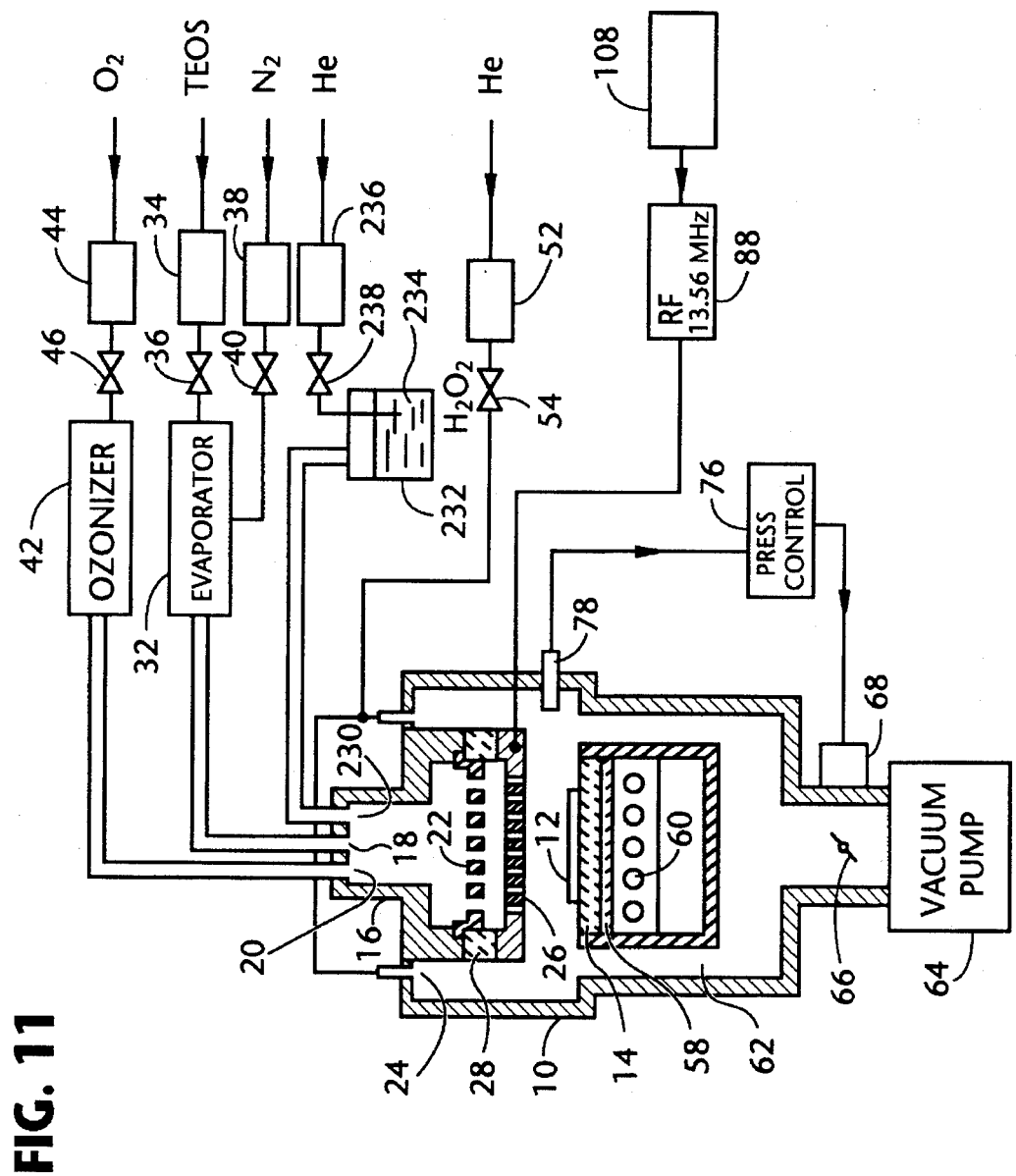
FIG. 11 is a diagrammatic illustration of a modification of the plasma CVD apparatus of FIG. 1.

This example is generally similar to Examaple 1, but, as a modification, hydrogen peroxide gas is introduced into the reaction chamber together with TEOS gas and ozone-oxygen gas. FIG. 11 shows the addition of a hydrogen peroxide feed line to the plasma CVD apparatus of FIG. 1. The manifold 16 of the reaction chamber 10 has an additional gas intake 230 to take in hydrogen peroxide gas. The gas intake 230 is connected to a thermostatic vessel 232 in which liquid hydrogen peroxide 234 is vaporized by bubbling with helium gas which is supplied through a mass flow controller 236 and a valve 238. The temperature in the thermostatic vessel 232 is controlled in the range from 10° to 20° C.

In this example, a 13.56 MHz RF oscillator 92 is used to apply a RF voltage to the electrode 26 in the reaction chamber 10, and a pulse generator 108 is used to cyclically switch on and off the output of the RF oscillator 92 and, when desired, vary the amplitude of the RF output.

In this example plasma CVD was performed under the following conditions. The pressure in the reaction chamber 10 was 1 torr; the temperature of the substrate 12 was 350° C.; RF power at the electrode 26 was 100 W; flow rate of TEOS gas was 50 sccm; flow rate of ozone-oxygen gas was 1 slm, and ozone concentration in this gas was 5 vol %. As shown in FIGS. 12 to 15, the substrate 12 had aluminum wiring lines 110 on the surface.

Figure 12:
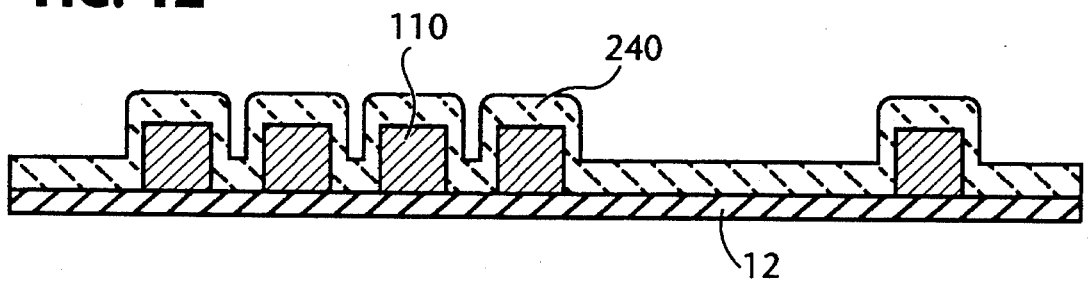
FIGS. 12, 13, 14 and 15 show, in elevational sectional views, four different films deposited by operating the CVD apparatus of FIG. 11 in four different ways, respectively.

First, as a reference, plasma CVD was performed by using only TEOS gas and pure oxygen gas as reactant gases. FIG. 12 shows a sectional profile of a silicon oxide dielectric film 240 deposited by this plasma CVD operation.

Figure 13:
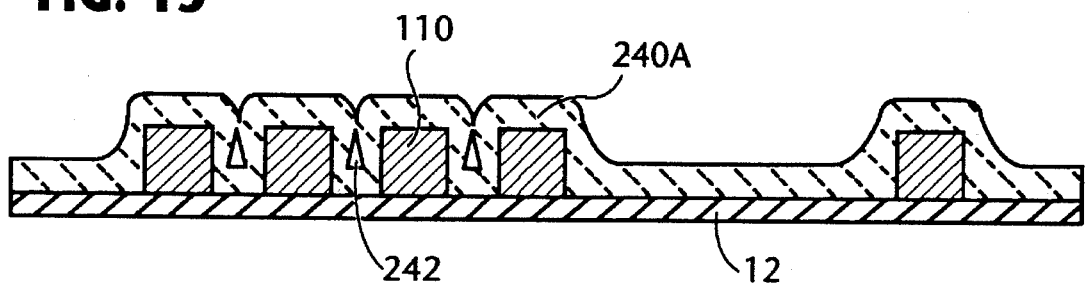

Next, ozone-oxygen gas (5% ozone) was used instead of pure oxygen gas. Hydrogen peroxide was not used. FIG. 13 shows the result. By comparison with the film 240 in FIG. 12, the film 240A in FIG. 13 is considerably improved in step coverage, but voids 242 appear in spaces with aspect ratios greater than 1.0.

Figure 14:
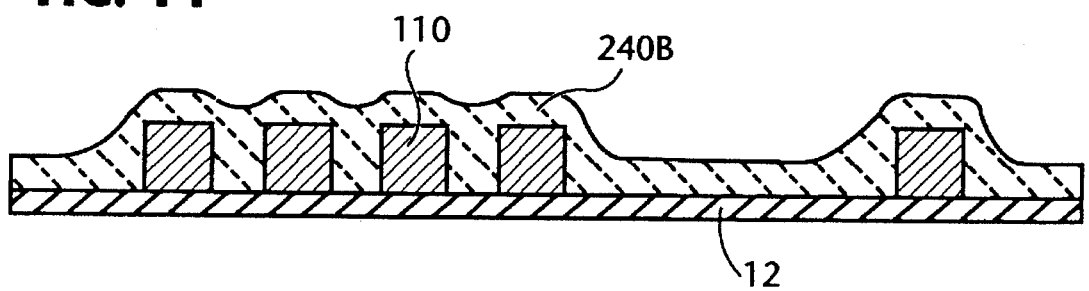

Next, hydrogen peroxide gas was used together with TEOS gas and ozone-oxygen gas. The flow rate of $H_2O_2$ was 5 sccm. The result is shown in FIG. 14. The deposited film 240B is very good in step coverage and free of voids even in spaces with aspect ratios greater than 1.0. Besides, on the isolated aluminum line the film 240B has a smoother profile than the film 240A in FIG. 13. Presumably the effect of the addition of $H_2O_2$ is attributed to the following phenomena.

In the reaction chamber $H_2O_2$ decomposes into water $H_2O$ and oxygen radical •0, and these decomposition products promote polymerization and other reactions of TEOS and its decomposition products. Therefore the formation of the film forming precursor 122 shown in FIG. 3(A) is promoted, and in the presence of water vapor the pseudo-liquid precursor layer 128 shown in FIG. 3(B) is formed even when oxygen plasma exists in the vicinity of the substrate.

Figure 15:
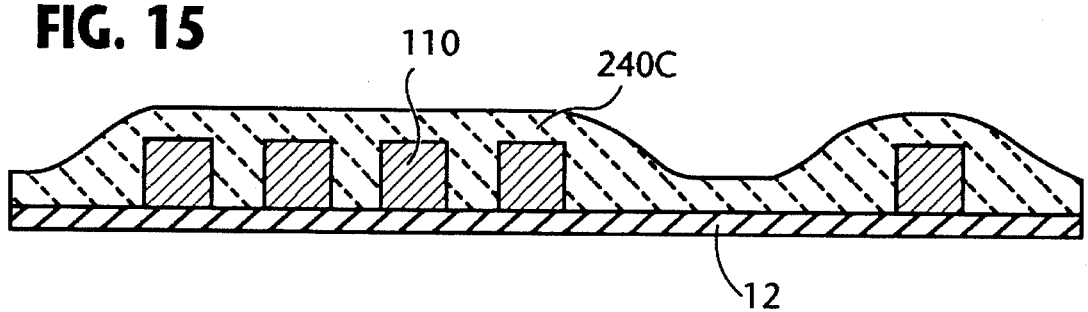

In the next run, hydrogen peroxide was used in the same manner as in the foregoing run. In this case the RF power for producing plasma was cyclically switched on and off with a frequency of 1Hz and with a duty ratio of 30%. The result is shown in FIG. 15. The deposited film 240C is still better than the film 240B in FIG. 14 in surface smoothness.

More better results can be obtained by using a RF voltage of a relatively low frequency, e.g. 450 kHz, together with the 13.56 MHz RF voltage in the same manner as in Example 1 or Example 2.

Also it is possible to use hydrogen peroxide in the method of Example 3 with the apparatus in FIGS. 8 and 9.

In place of hydrogen peroxide, it is possible to use water, hydrogen or a suitable organic compound that forms water by reaction with oxygen, such as hydrocarbon, alcohol, carbonyl compound or carboxyl acid, though the effect is somewhat variable.

EXAMPLE 6

This is a modification of Example 1 in respect of reactant gases. In this example the silicon source is altered to octamethylcyclotetrasiloxane (abbreviated to OMCTS). It is intended to deposit a film of silicon oxynitride (for convenience, expressed as SION) by using ammonia gas as the nitrogen source.

Figure 16:
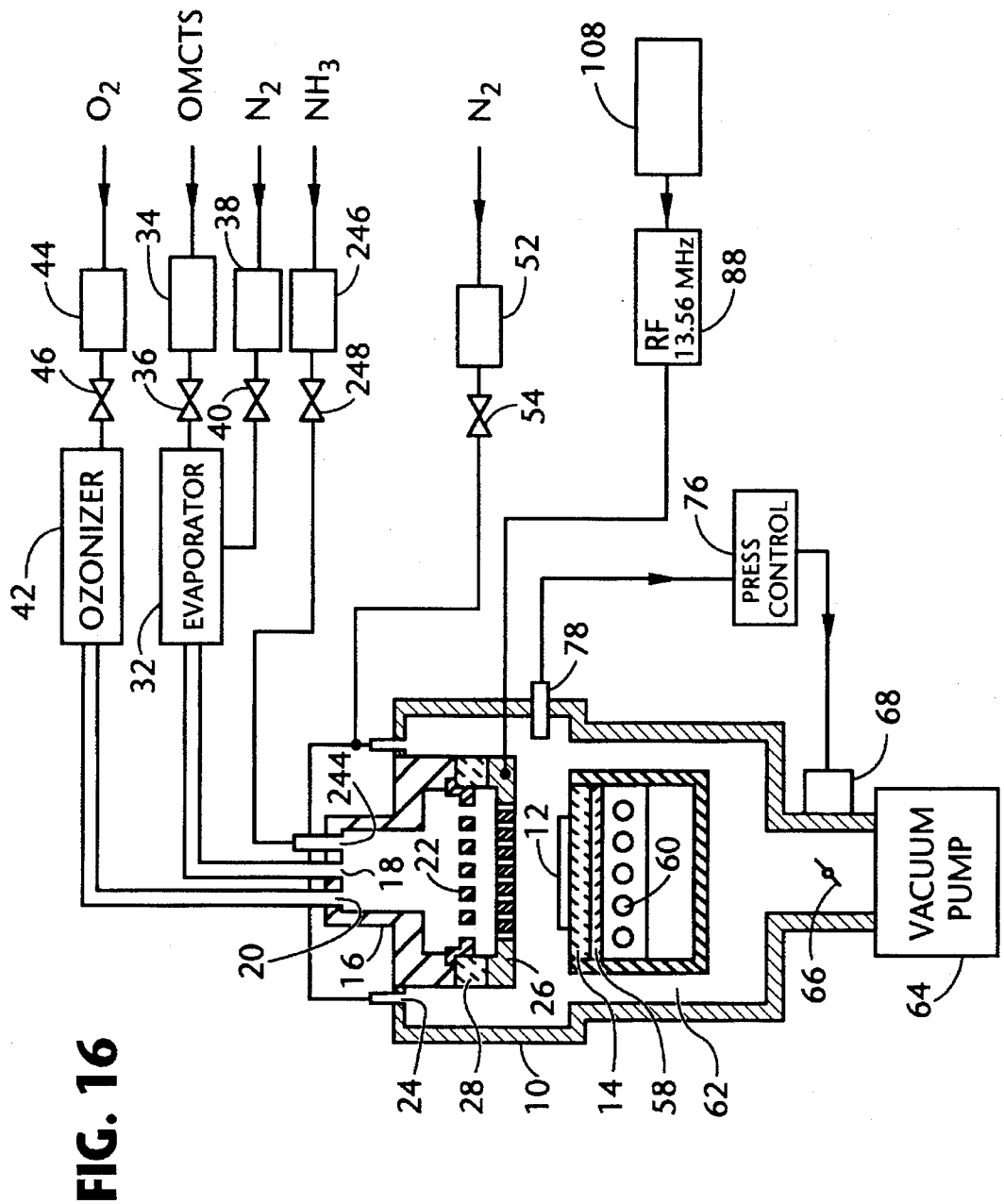
FIG. 16 is a diagrammatic illustration of another modification of the apparatus of FIG. 1.

As shown in FIG. 16, the apparatus used in this example is fundamentally similar to the apparatus of FIG. 1. To prepare OMCTS gas, liquid OMCTS is supplied to an evaporator 32 through a mass flow controller 34, and nitrogen gas, as a carrier gas, is introduced into the evaporator 32 through a mass flow controller 38 to bubble liquid OMCTS. The evaporator 32 is connected to the silicon source gas intake 18 of the manifold 16 of the reaction chamber 10. The manifold 16 has an additional gas intake 244 to which ammonia gas flows through a mass flow controller 246 and a valve 248.

In this example, a 13.56 MHz RF oscillator 92 is used to apply a RF voltage to the electrode 26 in the reaction chamber 10, and a pulse generator 108 is used to cyclically switch on and off the output of the RF oscillator 92 and, when desired, vary the amplitude of the RF output.

In this example plasma CVD was performed under the following conditions. The pressure in the reaction chamber 10 was 1 torr; the temperature of the substrate 12 was 300° C.; flow rate of OMCTS gas was 50 scccm; flow rate of ozone-oxygen gas was 0.1 slm and ozone concentration was 1 vol %; flow rate of ammonia gas was 1.0 slm; RF power at the electrode 24 was 300 W. The RF power was cyclically switched on and off with a frequency of 0.2 Hz (viz. one cycle in 5 sec) and with a duty ratio of 20%.

As the result, a SiON film containing 5–25% of nitrogen could be deposited at a deposition rate of about 120 nm/min. The obtained film was very good in step coverage, more than 90%, and proved to be a good dielectric film less than 1% in moisture content.

In this example the film growth mechanism is presumed to be as follows. While the RF power is off, a heat CVD reaction takes place between ozone and OMCTS to deposit a $SiO_2$ film which is relatively high in moisture content. When the RF power is switched on the precedingly deposited $SiO_2$ film is exposed to a plasma produced by dissociation of ozone and ammonia and partly nitrogenized by bombardments by nitrogen ions. At the same time SiON is further deposited by plasma CVD reactions of the reaction gas containing Si, O, N and H. In this example, the deposition rate is about 100 nm/min while RF power is off and reaches about 200 nm/min when RF power is on. Since in each cycle of on-off of the RF power the off time is 4 sec, the thickness of the $SiO_2$ film exposed to the ozone-ammonia plasma is about 12.5 nm. We have confirmed that $SiO_2$ films of comprable thicknesses can easily be nitrogenized by ammonia plasma and that when RF power for producing the plasma is cyclically switched on and off the nitrogenized film exhibits little gradient of chemical composition or film properties in the direction of film thickness.

In this example, still better results can be obtained by using a RF voltage of relatively low frequency such as, e.g. 450 kHz together with 13.56 MHz RF voltage in the same manner as in Example 1 or 2. It is possible to use a reaction chamber of the type shown in FIGS. 8 and 9 instead of cyclic on-off of RF power. Alternative to ammonia gas, it is possible to use nitrogen gas or a nitrogen and hydrogen mixed gas. If it is desired to increase the content of nitrogen in the deposited film, it is favorable to use a silicon source compound having Si—N bond such as, e.g., tris(dimethylamino)silane or tris(diethylamino)silane.

EXAMPLE 7

Figure 17:
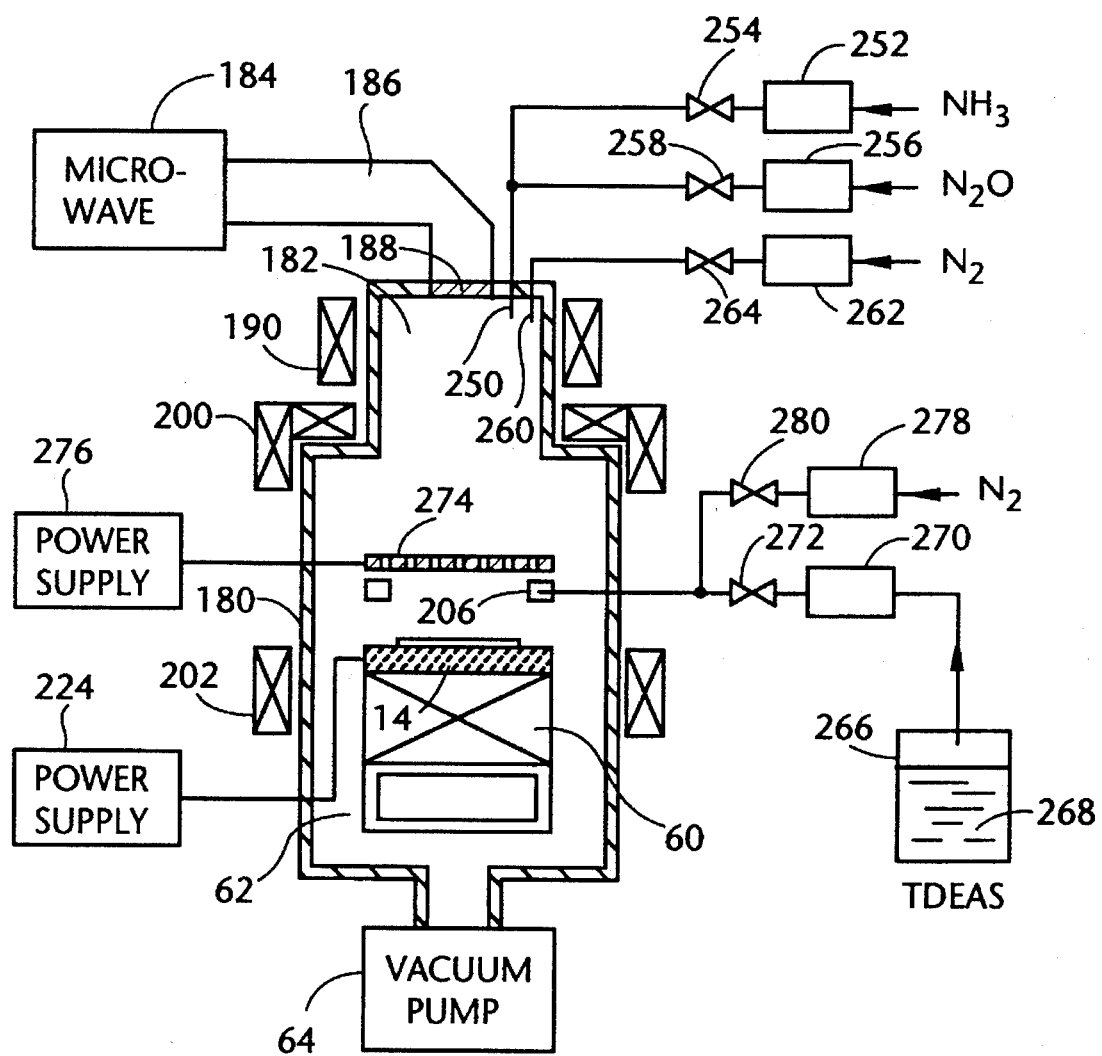
FIG. 17 is a diagrammatic illustration of a modification of the plasma CVD apparatus of FIG. 10.

In this example tris(diethylamino)silane (abbreviated to TDEAS) is chosen as the silicon source. As shown in FIG. 17, the plasma CVD apparatus used in this example is fundamentally similar to the apparatus of FIG. 10 used in Example 4. In order to produce a plasma containing nitrogen ion together with oxygen ion in the ion source chamber 182, ammonia gas, nitrogen gas and nitrous oxide ($N_2O$) gas are used. Ammonia gas flows to a gas intake 250 through a mass flow controller 252 and a valve 254, and $N_2O$ gas flows to the same intake 250 through a mass flow controller 256 and a valve 258. Nitrogen gas flows to another gas intake 260 through a mass flow controller 262 and a valve 264. The total gas pressure in the ion space chamber 182 is maintained at about 100 mtorr. In a thermostatic vessel 266 kept at 80° C., liquid TDEAS 268 is vaporized to supply TDEAS gas into the reaction chamber 180 through a mass flow controller 270, valve 272 and silicon source gas intakes 206. The gas feed line between the vessel 266 and the gas intakes 206 are kept at a temperature above 80° C.

In this apparatus the microwave source 184, primary electromagnet coil 190 and auxiliary electromagnet coils 200 and 202 are similar to the counterparts in the apparatus of FIG. 10. In the reaction chamber 180 there is a grid 274 through which ions and other particles can flow to the surface of the substrate 12. This grid 274 serves as an electrode, and variable voltages can be applied to the grid 274 from a power supply 276 in order to use the grid 274 as a shutter for temporarily blocking the flow of charged particles through the grid 272.

The substrate 12 is kept heated at 300° C. The pressure in the reaction chamber 180 is kept at about 1 mtorr by operating the vacuum pump 64.

In operation, 2.45 GHz microwave is transmitted into the ion source chamber 182 which is fed with $NH_3$, $N_2O$ and $N_2$ gases, and the primary electromagnet coil 190 produces a magnetic field of 875 gauss in the chamber 182 to cause ECR heating and consequently produce a plasma containing positive ions of oxygen, nitrogen and hydrogen. The magnetic field produced by the coil 190 promotes the movement of the plasma toward the reaction chamber 180. A suitable current is supplied to the auxiliary electromagnet coil 200 so as to produce a weak magnetic field in the direction from the ion source to the substrate 12, and also a current is supplied to the auxiliary electromagnet coil 202 so as to produce a weak magnetic field in the same direction for the purpose of uniformalizing the plasma approaching the substrate 12. Meanwhile, TDEAS gas is supplied into the reaction chamber 180.

Initially, a positive voltage is applied to the grid 274 in order that the positively chaged ions in the plasma are repelled by a positive electric field produced by the grid 274. Therefore, the ions do not arrive at the substrate surface. However, neutral radicals and molecules diffuse from the plasma in the ion source chamber 182 into the TDEAS gas in the reaction chamber 180 through the grid 274. On the surface of the substrate 12 thermal decompostion reactions of gas molecules are promoted by the diffused active radicals, whereby a SiON film is deposited on the substrate 12 with good step coverage. This operation is carried out until the deposited film thickness reaches about 10 nm. Then the positive voltage applied to the grid 274 is cut off, or changed to a negative voltage of small magnitude, to thereby allow the positively charged ions to pass through the grid 274 toward the substrate 12. As a result the precedingly deposited SiON film is subject to ion bombardments which are effective for expulsion of moisture and carbon from the film. Therefore, the film is improved in properties and becomes indistinguishable from a plasma CVD film, while further deposition of SiON by plasma CVD proceeds. The switching of the voltage at the grid 274 is cyclically repeated with a period of 1 to 10 sec in order to alternate thermal CVD and plasma CVD accompanied by transformation of the thermal CVD film to a plasma CVD film. Consequently a plasma CVD film of SiON is formed with good step coverage and gap filling capability.

Instead of the repulsive electric field produced by the grid 274 in this example, it is optional to use a mirror magnetic field that can be produced by the auxiliary electromagnet coil 200, a cusp magnetic field that can be produced by the auxiliary electromagnet coil 202 or a repulsive electric field that can be produced by applying a positive voltage to the susceptor plate 14 from the bias power supply 224. Still alternatively it is possible to use a mechanical shutter (not shown). In the case of using a mechanical shutter the diffusion of active radicals is also blocked, and therefore it is favorable to provide a supplementary device to supply free radicals into the reaction gas in the vicinity of the substrate 12 to thereby promote thermal CVD reactions.

What is claimed is:

1. A method of forming a silicon oxide film on a heated substrate by chemical vapor deposition (CVD) using an organosilicon compound gas and oxygen gas as essential reactants in the presence of a plasma containing oxygen ions, said plasma having an intensity represented by the density of said oxygen ions impinging on a surface of said substrate, the method comprising the steps of:

(a) depositing a first plasma CVD silicon oxide film on the substrate while the intensity of said plasma is at a first level;

(b) lowering the intensity of said plasma from said first level to a second level and depositing an intermediate CVD silicon oxide film on said first plasma CVD silicon oxide film, said intermediate CVD silicon oxide film having a step coverage and a gap filling capability that are superior to that of said first plasma CVD silicon oxide film and having a film quality that is inferior to that of said first plasma CVD silicon oxide film, wherein said film quality is measured by criteria comprising moisture content; and (c) raising the intensity of said plasma from said second level to said first level and depositing a second plasma CVD silicon oxide film on said intermediate CVD silicon oxide film, thereby converting said intermediate CVD silicon oxide film into a silicon oxide film which is substantially equivalent in film quality to said first and second plasma CVD silicon oxide films.

2. A method according to claim 1, wherein said second level of the intensity of said plasma is nearly zero.

3. A method according to claim 1, wherein said plasma is produced by applying RF power to a reactant gas mixture containing said organosilicon compound gas and oxygen gas in a reaction chamber in which the substrate is placed, the level of the intensity of said plasma being lowered and raised by varying the magnitude of the RF power.

4. A method according to claim 3, wherein the RF power is switched off for a first predetermined time to lower the intensity of said plasma and switched on for a second predetermined time to again raise said intensity.

5. A method according to claim 1, wherein a duty ratio of the applied RF power is in the range from 40 to 60% wherein said duty ratio equals the ratio of said first predetermined time to the sum of said first predetermined time and said second predetermined time.

6. A method according to claim 1, wherein said plasma is produced in an ion source chamber and introduced into a reaction chamber in which the substrate is placed while a reactant gas mixture containing said organosilicon compound gas and oxygen gas is supplied into the reaction chamber, the intensity of said plasma in the reaction chamber being lowered and raised by controlling the flow of the plasma from the ion source chamber into the reaction chamber.

7. A method according to claim 6, wherein the step (b) is performed by blocking the flow of said plasma form the ion source chamber into the reaction chamber.

8. A method according to claim 1, wherein said oxygen gas contains ozone.

9. A method according to claim 8, wherein the concentration of ozone in the oxygen gas is in the range from 1% to 10% by volume.

10. A method according to claim 1, wherein said organosilicon compound is selected from the group consisting of tetraethylorthosilicate, tetramethylsilane, triethyoxysilane, tetramethylcyclotetrasiloxane, octamethylcyclotetrasiloxane, hexamethyldislazane, tris(dimethylamino)silane and tris(diethylamino)silane.

11. A method according to claim 1, wherein another gaseous reactant which provides water vapor is added to said reactant gas mixture, said another gaseous reactant being selected from the group consisting of hydrogen peroxide, hydrogen, water, hydrocarbons, alcohols, carbonyl compounds and carboxylic acids.

12. A method according to claim 1, wherein the steps (a) and (b) are successively performed within a time period in the range from about 0.1 seconds to about 30 seconds and steps (b) and (c) are successively performed within a time period in the range of from about 0.1 seconds to about 30 seconds.

13. A method according to claim 12, wherein with the steps (a) and (b) are successively performed within a time period in the range from about 0.1 sec to about 30 sec and the steps (b) and (c) are also successively performed within a time period in the range from about 0.1 sec to about 30 sec.

14. A method of forming a silicon oxide film on a heated substrate by chemical vapor deposition (CVD) using an organosilicon compound gas and oxygen gas as essential reactants, the method comprising the steps of:

(a) applying a plasma containing oxygen ions to the substrate and depositing a first plasma CVD silicon oxide film on said substrate;

(b) interrupting the application of said plasma and depositing an intermediate CVD silicon oxide film on said first plasma CVD silicon oxide film, said intermediate CVD silicon oxide film is superior to said first plasma CVD silicon oxide film in step coverage and gap filling capability and inferior to said first plasma CVD silicon oxide film in film quality, wherein said film quality is measured by criteria comprising moisture content; and (c) again applying said plasma to the substrate and depositing a second plasma CVD silicon oxide film on said intermediate CVD silicon oxide film thereby converting said intermediate CVD silicon oxide film into a silicon oxide film which is substantially equivalent in film quality to said first and second plasma CVD silicon oxide films.

15. A method according to claim 14, wherein said plasma is produced by applying RF power to a reactant gas mixture containing said organosilicon compound gas and oxygen gas in a reaction chamber in which the substrate is placed, the RF power being cyclically switched on for a first predetermined time and off for a second predetermined time to thereby perform the steps (a), (b) and (c).

16. A method according to claim 15, wherein a duty ratio of the applied RF power is in the range from 40 to 60%, wherein said duty ratio equals the ratio of said first predetermined time to the sum of said first predetermined time and said second predetermined time.

17. A method according to claim 14, wherein said plasma is produced in an ion source chamber and introduced into a reaction chamber and introduced into a reaction chamber in which the substrate is placed while a reactant gas mixture containing said organosilicon compound gas and oxygen gas is supplied into the reaction chamber, the application of said plasma to the substrate being interrupted in the step (b) by blocking the flow of the plasma from the ion source chamber into the reaction chamber.

18. A method according to claim 14, wherein said oxygen gas contains ozone.

19. A method according to claim 18, wherein the concentration of ozone in the oxygen gas is in the range from 1% to 10% by volume.

20. A method according to claim 14 wherein organosilicon compound is selected from the group consisting of tetraethylorthosilicate, tetramethylsilane, triethyoxysilane, tetramethylcyclotetrasiloxane, octamethylcyclotetrasiloxane, hexamethyldislazane, tris(dimethylamino)silane and tris(diethylamino)silane.

21. A method according to claim 14 wherein another gaseous reactant which provides water vapor is added to said reactant gas mixture, said another gaseous reactant being selected form the group consisting of hydrogen peroxide, hydrogen, water, hydrocarbons, alcohols, carboxyl compounds and carboxylic acids.

* * * * *